(12) United States Patent
Shih et al.

(10) Patent No.: US 9,741,862 B2
(45) Date of Patent: Aug. 22, 2017

(54) THIN FILM TRANSISTOR AND MANUFACTURING METHOD THEREOF

(71) Applicant: HON HAI PRECISION INDUSTRY CO., LTD., New Taipei (TW)

(72) Inventors: Po-Li Shih, Hsinchu (TW); Yi-Chun Kao, Hsinchu (TW); Chih-Lung Lee, Hsinchu (TW); Hsin-Hua Lin, Hsinchu (TW); Kuo-Lung Fang, Hsinchu (TW)

(73) Assignee: HON HAI PRECISION INDUSTRY CO., LTD., New Tapiei (TW)

( * ) Notice: Subject to any disclaimer, the term of this patent is extended or adjusted under 35 U.S.C. 154(b) by 0 days.

(21) Appl. No.: 14/793,272

(22) Filed: Jul. 7, 2015

(65) Prior Publication Data
US 2016/0351717 A1    Dec. 1, 2016

(30) Foreign Application Priority Data
May 25, 2015   (TW) .............................. 104116716 A (51) Int. Cl.
| | | |
|---|---|---|
| *H01L 29/786* | (2006.01) | |
| *H01L 29/66* | (2006.01) | |
| *H01L 29/423* | (2006.01) | |
| *H01L 29/417* | (2006.01) | |
| *H01L 21/4763* | (2006.01) | |

(52) U.S. Cl.
CPC .... *H01L 29/7869* (2013.01); *H01L 21/47635* (2013.01); *H01L 29/41791* (2013.01); *H01L 29/42384* (2013.01); *H01L 29/66969* (2013.01)

(58) Field of Classification Search
CPC ............ H01L 29/7869; H01L 29/4171; H01L 29/66969; H01L 29/42384; H01L 21/47635
See application file for complete search history.

(56) References Cited

U.S. PATENT DOCUMENTS

| | | | | |
|---|---|---|---|---|
| 5,427,962 | A * | 6/1995 | Sasaki | ............... H01L 29/66765 205/124 |
| 6,558,992 | B2 * | 5/2003 | Wong | .................. H01L 27/1214 257/E21.414 |
| 8,618,543 | B2 * | 12/2013 | Lee | .................... H01L 21/02554 257/43 |
| 2013/0037807 | A1 * | 2/2013 | Fukaya | ............... H01L 27/1225 257/57 |

FOREIGN PATENT DOCUMENTS

TW    201140847 A1    11/2011

* cited by examiner

*Primary Examiner* — William Coleman
(74) *Attorney, Agent, or Firm* — Steven Reiss (57) ABSTRACT

A thin film transistor (TFT) includes a gate, a gate insulation layer, a channel, a source, and a drain. The gate is formed on a substrate. The gate insulation layer covers the gate and the substrate. The channel layer is formed on the gate insulation layer to correspond with the gate. The source and a drain are respectively coupled at opposite sides of the channel layer. The channel layer includes a conductor layer and a semiconductor layer. The semiconductor layer includes a first portion and a second portion respectively coupled at opposite sides of the conductor layer.

11 Claims, 9 Drawing Sheets

THIN FILM TRANSISTOR AND MANUFACTURING METHOD THEREOF

CROSS-REFERENCE TO RELATED APPLICATIONS

This application claims priority to Taiwanese Patent Application No. 104116716 filed on May 25, 2015, the contents of which are incorporated by reference herein.

FIELD

The subject matter herein generally relates to a thin film transistor (TFT) and a manufacturing method of the TFT.

BACKGROUND

TFTs are widely used in electronic devices to serve as a switch component. Generally, a TFT can include a gate, a source, a drain, and a channel layer coupling the source to the drain. The electron mobility of the channel layer is one of the most important characteristics for the TFT because it is a decisive factor for the conductivity of the channel layer.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a thin film transistor (TFT) and a manufacturing method of the TFT.

Figure 1:
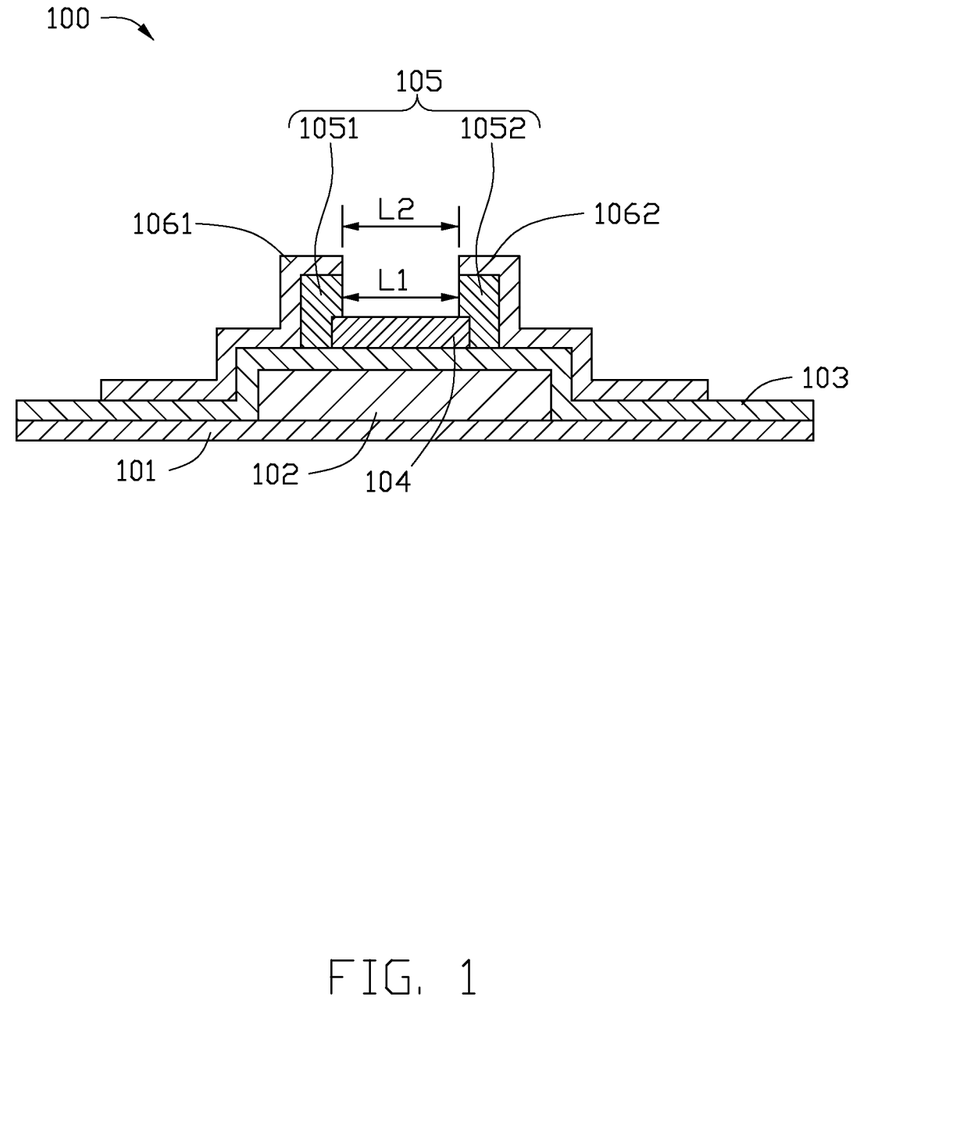
FIG. 1 is a cross-sectional view of a thin film transistor (TFT).
Figure 2:
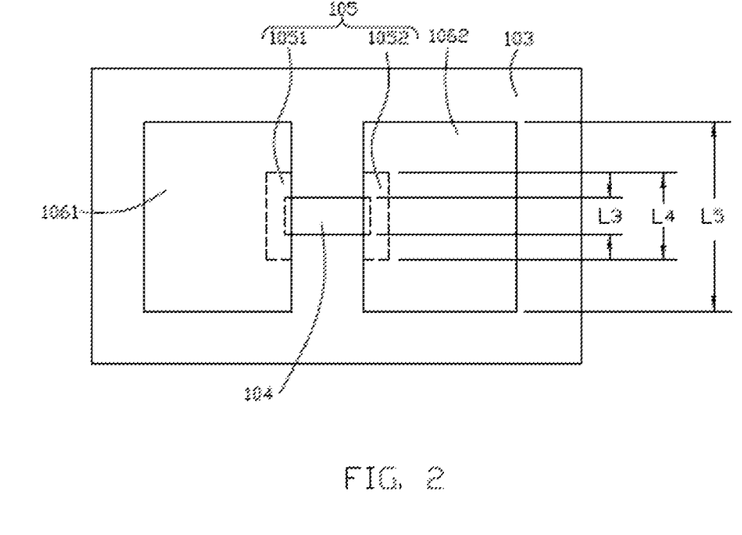
FIG. 2 illustrates a plan view of the TFT of FIG. 1.

FIG. 1 illustrates a cross-sectional view of a TFT 100, and FIG. 2 illustrates a plan view of the TFT 100. The TFT 100 includes a substrate 101, a gate 102, a gate insulation layer 103, a conductor layer 104, a semiconductor layer 105, a source 1061, and a drain 1062. The gate 103 is formed on a surface of the substrate 101. The gate insulation layer 103 is formed on the substrate 101 and the gate 102 and covers the gate 102 and the substrate 101. The conductor layer 104 is formed on the gate insulation layer 103 corresponding with the gate 102. The conductor layer 104 and the gate 102 are insulated from each other via the gate insulation layer 103. The semiconductor layer 105 is coupled with the conductor layer 104. In at least one embodiment, the semiconductor layer 105 includes a first portion 1051 and a second portion 1052 respectively coupled with opposite ends of the conductor layer 104. The source 1061 and the drain 1062 are located on the gate insulation layer 103 and are respectively coupled to the first portion 1051 and the second portion 1052.

In the illustrated embodiment, a portion of the conductor layer 104 is covered by the semiconductor layer 105, and the other portion of the conductor layer 104 between the first portion 1051 and the second portion 1052 is exposed out of the semiconductor layer 105. Further, the first portion 1051 and the second portion 1052 are separated from each other by a first distance L1. The source 1061 and the drain 1062 are separated from each other by a second distance L2. In at least one embodiment, the first distance L1 is less than or equal to the second distance L2. The first distance L1 is equal to the second distance L2. The first portion 1051 of the semiconductor layer 105 is covered by the source 1061 and the second portion 1052 of the semiconductor layer 105 is covered by the drain 1062.

As illustrated in FIG. 2, the conductor layer 104 can have a width L3, the semiconductor layer 105 can have a width L4, and the source 1061 and the drain have a width L5. As shown in FIG. 2, L3 is less than L4, and L4 is less than L5.

In at least one embodiment, the conductor layer 104 is made of conductive materials, such as metal materials or compound metal materials. For example, the conductive materials can be molybdenum (Mo), aluminum (Al), chromium (Cr), copper (Cu), neodymium (Nd), or the compound materials thereof. The semiconductor layer 105 is made of semiconductive materials, such as amorphous silicon (A-Si), metal oxides, or organic materials. The semiconductor layer 105 is made of metal oxides, such as indium gallium zinc oxide (IGZO), indium zinc oxide (IZO), gallium zinc oxide (GZO), zinc tin oxide (ZTO), or zinc oxide (ZnO). The source 1061 and the drain 1062 can be made the same materials with the conductor layer 104. The source 1061, the drain 1062, and the semiconductor layer 105 can be made using the same photo etching process (PEP).

In the illustrated embodiment, the conductor layer 104 and the semiconductor layer 105 corporately form a channel layer (not labeled) of the TFT 100. The channel layer of the TFT 100 can include the conductor layer 104 and the semiconductor layer 105. An electron mobility of the conductor layer 104 is greater than an electron mobility of the semiconductor layer 105 because the conductivity of the conductor layer 104 is better than the conductivity of the semiconductor layer 105. Thus, an electron mobility of the channel layer of the TFT 100 is greater than an electron mobility of a traditional channel layer which is completely made of semiconductive materials (for example, metal oxides). When a voltage is applied to the TFT 100, a current from the source 1061 will flow to the drain 1062 via the first portion 1051, the conductor layer 104 and the second portion 1052 in turn. The sensitivity of the TFT 100 can be improved by the conductor layer 104 because it can promote the current to flow to the drain 1062 due to it's better conductivity and greater electron mobility.

Figure 3:
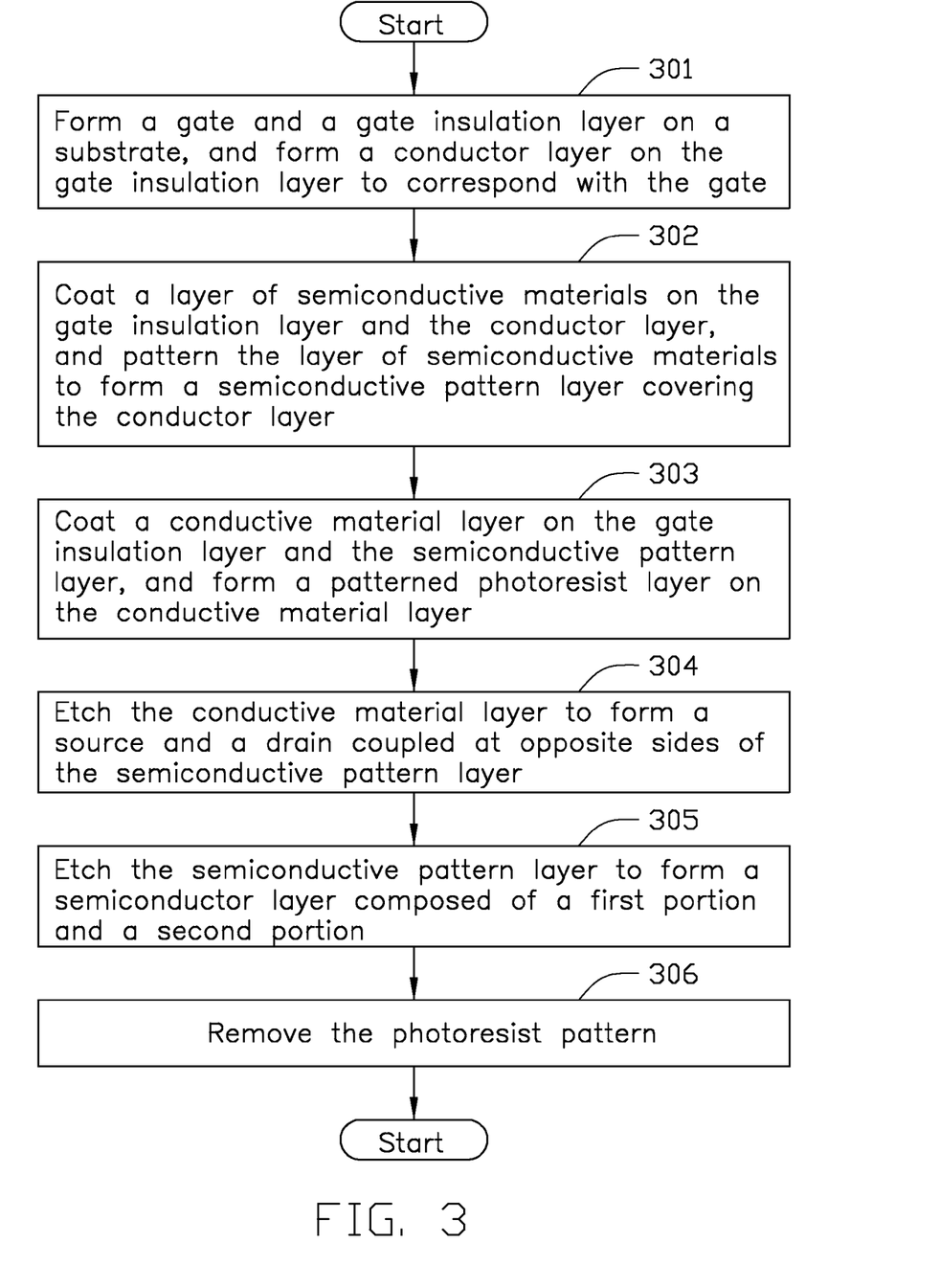
FIG. 3 illustrates a flowchart of a method for manufacturing the TFT of FIG. 1.

FIG. 3 illustrates a flowchart of a method for manufacturing the TFT 100 of FIG. 1. The method is provided by way of example, as there are a variety of ways to carry out the method. Each block shown in FIG. 3 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 301.

Figure 4:
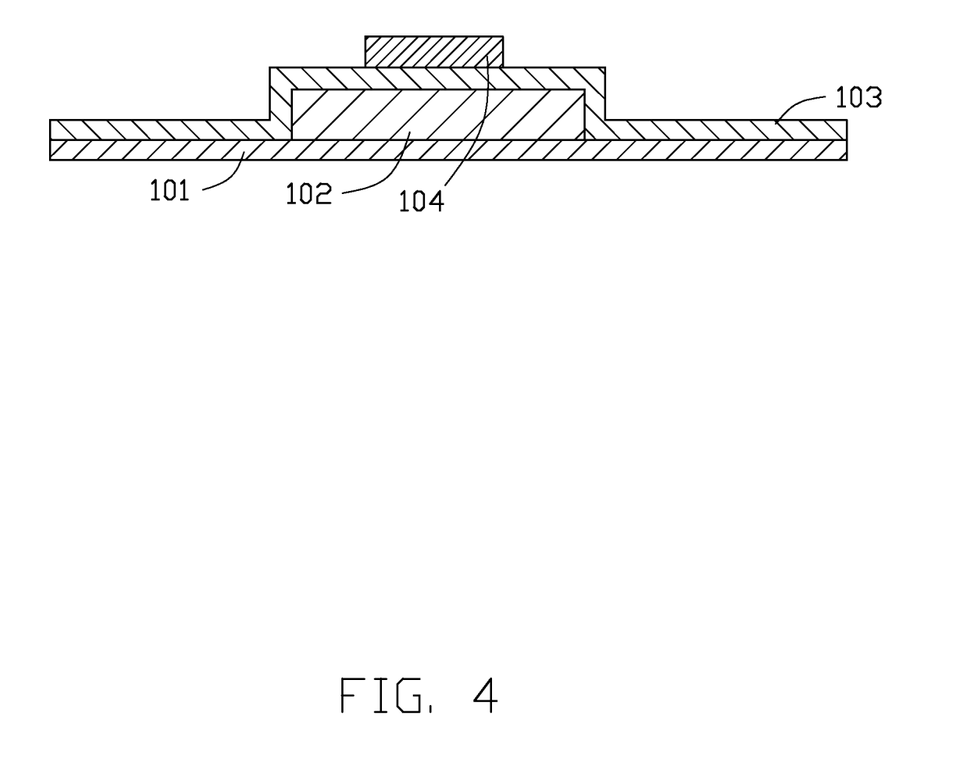
FIG. 4 is a cross-sectional view illustrating a gate and a gate insulation layer are formed on a substrate, and a conductor layer is formed on the gate insulation layer to correspond with the gate.

At block 301, referring to FIG. 4, a gate 102 and a gate insulation layer 103 are formed on a substrate 101 in that order, and a conductor layer 104 is formed on the gate insulation layer 103 to correspond with the gate 102.

In at least one embodiment, a layer of conductive materials is first coated on the substrate 101. Then, the layer of conductive materials coated on the substrate 101 is patterned to form the gate 102 on the substrate 101. The layer of conductive materials can be patterned using a photo etching process (PEP). The conductive materials can be metal materials, metal alloy materials, or metal oxide materials. The substrate 101 can be a transparent substrate such as a glass substrate, a quartz substrate, a flexible substrate. In other embodiment, the first substrate 101 can be a non-transparent substrate or a translucent substrate. When the gate 102 is formed on the substrate 101, a layer of insulation materials is coated on the gate 100 and the substrate 101 to form the gate insulation layer 103. The gate insulation layer 103 can be made of inorganic materials such as silicon nitride (SiNx) and silicon oxide (SiOx). The method for forming the gate insulation layer 103 can be a plasma chemical vapor deposition (PCVD) method. A layer of conductive materials is coated on the gate insulation layer 103 and the layer of conductive materials is patterned for example using the PEP method to form the conductor layer 104 on the gate insulation layer 103 to correspond with the gate 102. The conductor layer 104 and the gate 102 can be made the same conductive materials.

Figure 5:
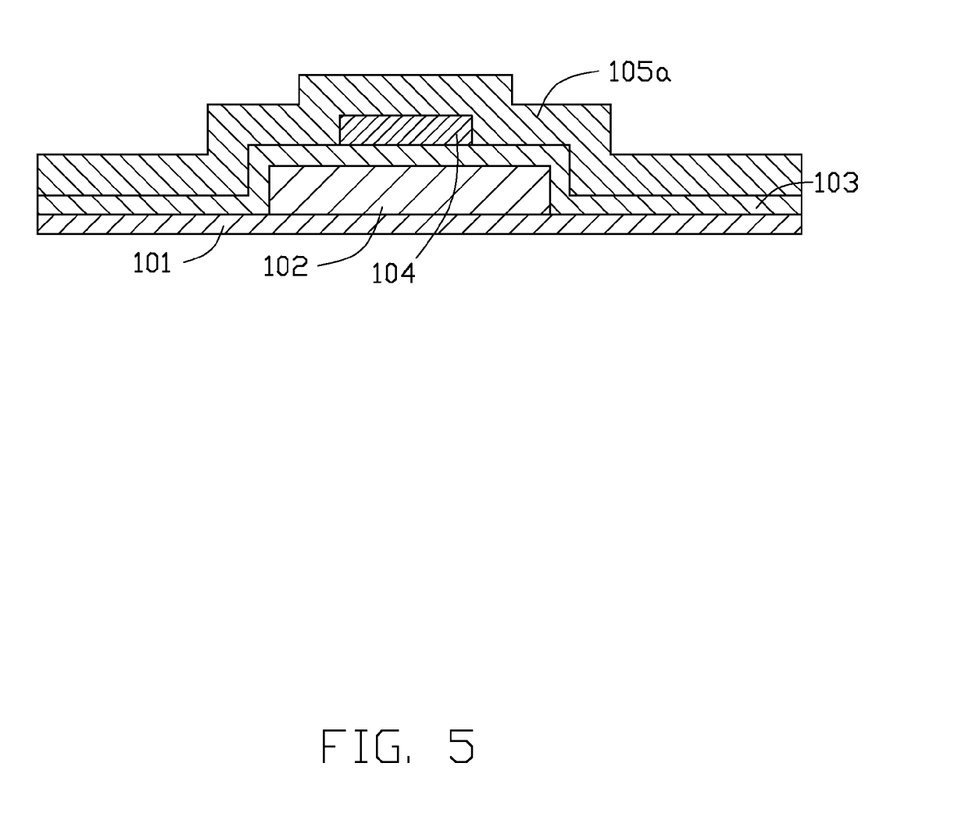
FIG. 5 is a cross-sectional view illustrating a layer of semiconductive materials is coated on the gate insulation layer and the conductor layer.
Figure 6:
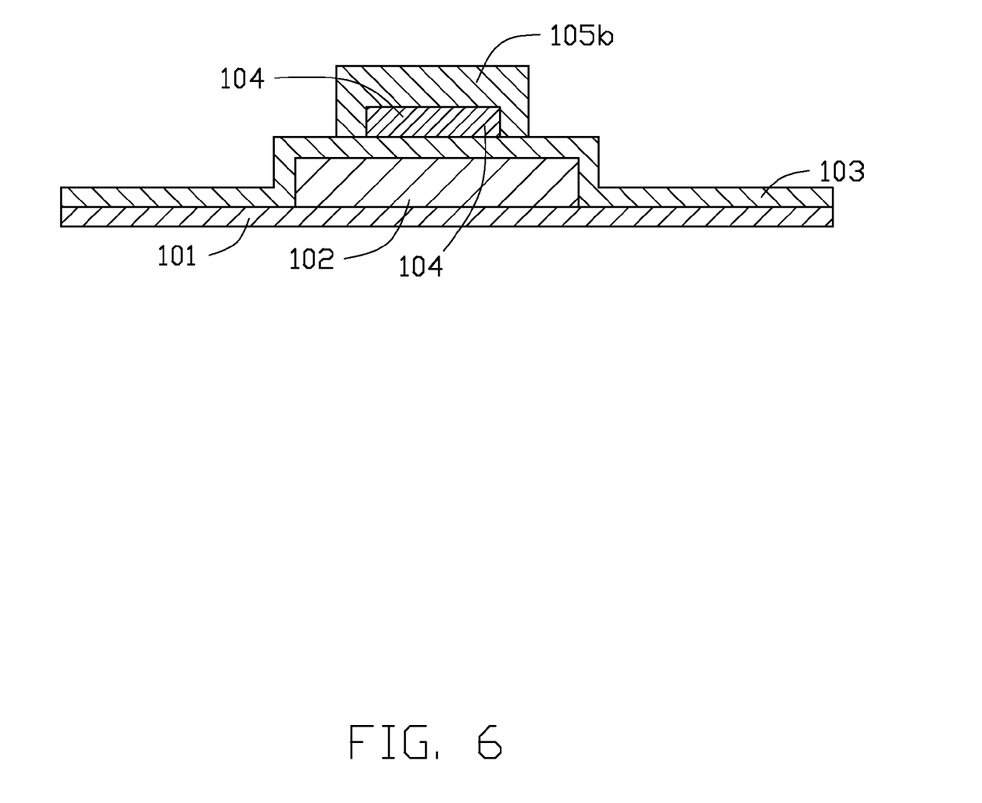
FIG. 6 is a cross-sectional view illustrating the layer of semiconductive materials is patterned to form a semiconductive pattern layer covering the conductor layer.

At block 302, referring to FIG. 5 and FIG. 6, a layer of semiconductive materials 105a is coated on the gate insulation layer 103 and the conductor layer 104 to cover both the gate insulation layer 103 and the conductor layer 104, and the layer of semiconductive materials 105a is patterned to form a semiconductive pattern layer 105b covering the conductor layer 104. In at least one embodiment, the layer of conductive materials 105a is IGZO.

Figure 7:
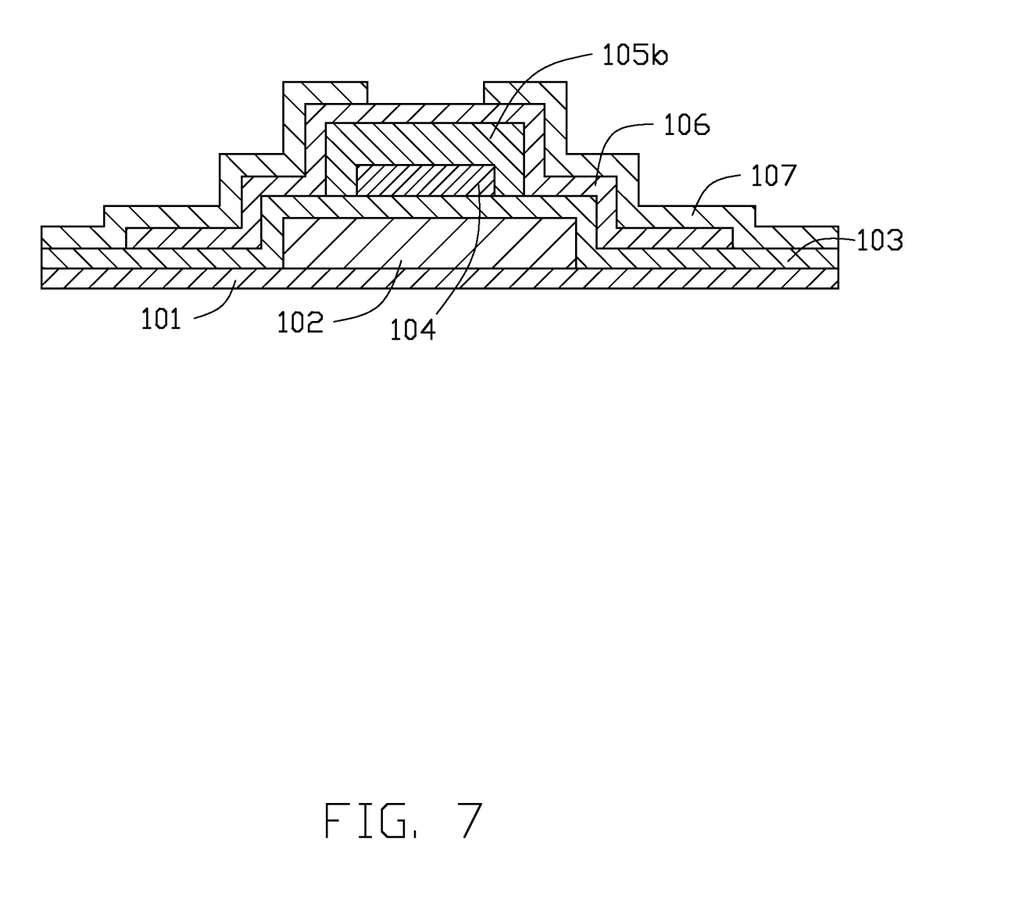
FIG. 7 is a cross-sectional view illustrating a conductive material layer is coated on the gate insulation layer and the semiconductive pattern layer, and a patterned photoresist layer is formed on the conductive material layer.

At block 303, as shown in FIG. 7, a conductive material layer 106 is coated on the gate insulation layer 103 and the semiconductive pattern layer 105b, and a photoresist layer is formed on the conductive material layer 106 and is patterned to form a photoresist pattern 107. The photoresist layer can be patterned using a photo etching process to form an opening corresponding with the semiconductive pattern layer 105b, thereby exposing a portion of the conductive material layer 106. The conductive material layer 106 and the gate 102 can be made of the same materials. The conductive material layer 160 covers the semiconductive pattern layer 150b and at least a portion of the gate insulation layer 103.

Figure 8:
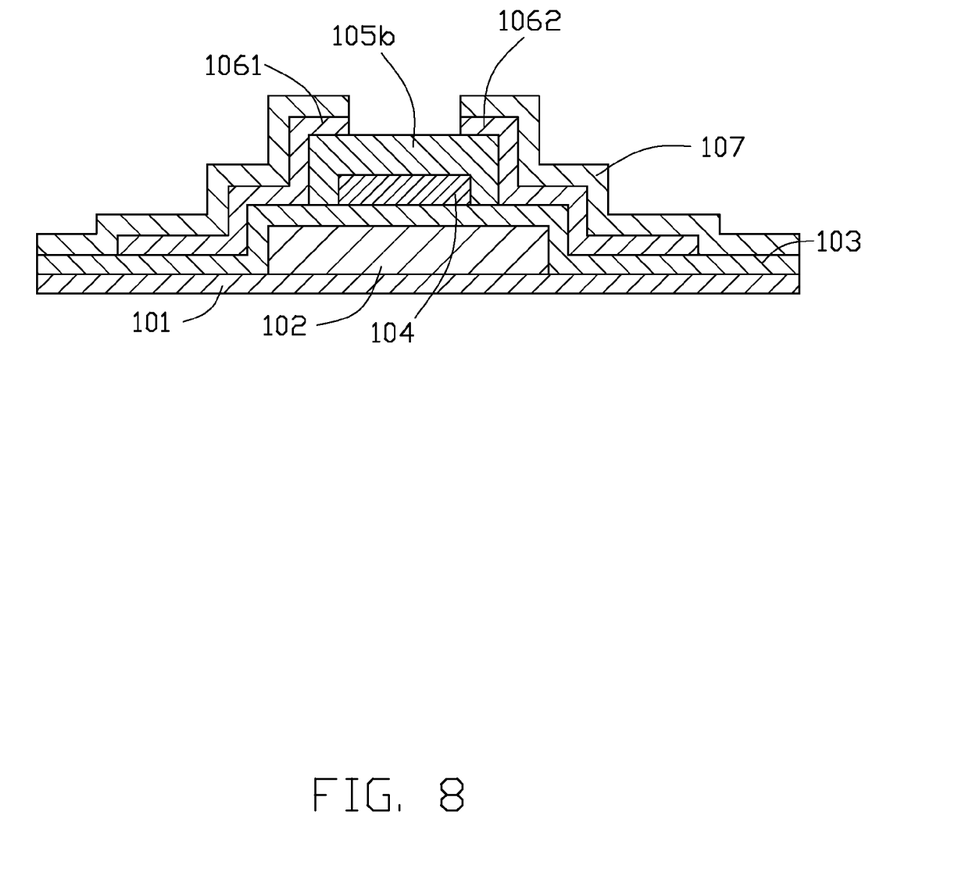
FIG. 8 is a cross-sectional view illustrating a source and a drain are formed and coupled at opposite sides of the semiconductive pattern layer.

A block 304, as shown in FIG. 8, a source 1061 and a drain 1062 are formed by removing a portion of the conductive material layer 106 which is exposed from the opening of the photoresist pattern 107 using an etching processing. The source 1061 and the drain 1062 are respectively coupled at opposite sides of the semiconductive pattern layer 105b.

Figure 9:
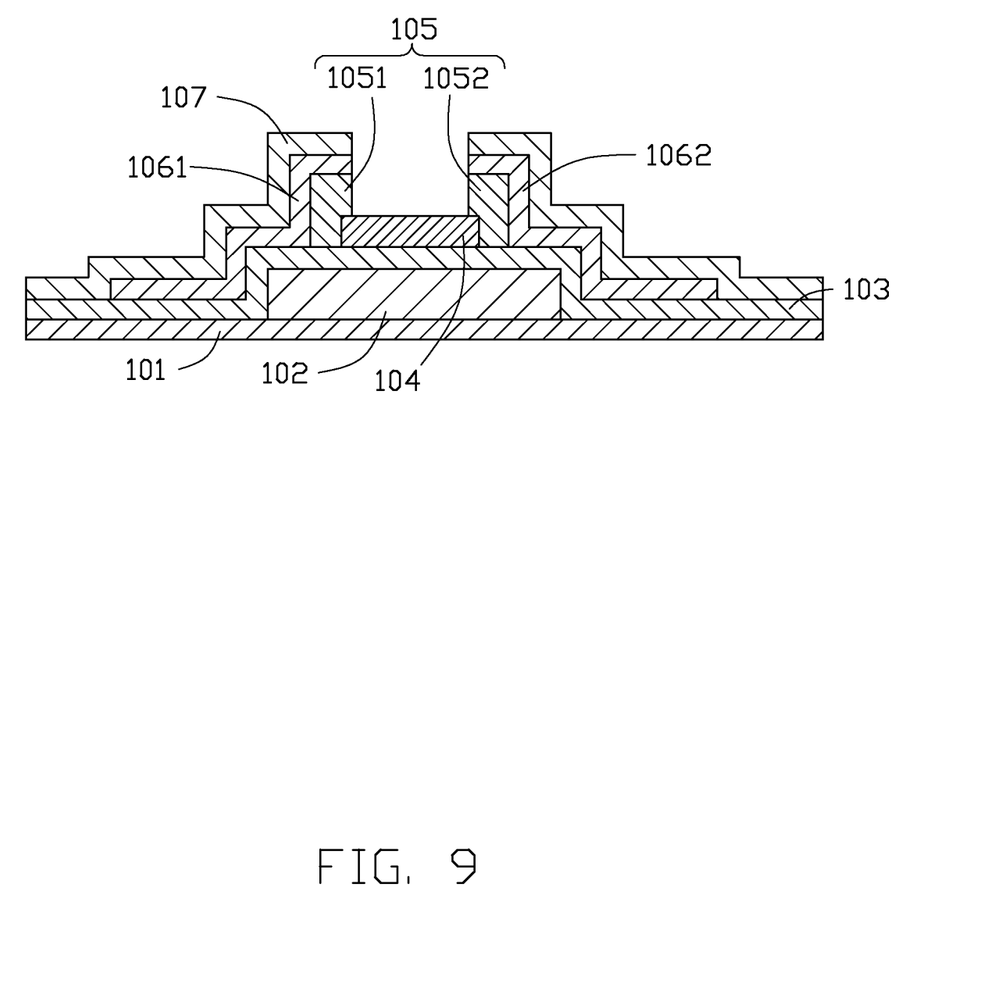
FIG. 9 is a cross-sectional view illustrating a semiconductor layer composed of a first portion and a second portion is formed by removing a portion of the semiconductive pattern layer between the source and the drain using an etching process.

At block 305, referring to FIG. 9, form a semiconductor layer 105 composed of a first portion 1051 and a second portion 1052 by removing a portion of the semiconductive pattern layer 105b between the source 1061 and the drain 1062 using an etching process. In this embodiment, the etching process can use aluminic acid to etch the semiconductive pattern layer 105b.

In this embodiment, a first distance L1 between the first portion 1051 and the second portion 1052 is created during the etching process of the semiconductive pattern layer 105b, and a second distance between the source 1061 and the drain 1062 is created during the etching process of the conductive material layer 106. In this embodiment, the first distance L1 is less than or equal to the second distance L2.

At block 306, the photoresist pattern 107 is removed to form the TFT 100 as shown in FIG. 1. In at least one embodiment, the semiconductor layer 105 and the source 1061 and the drain 1062 can be formed in a same photo etching process to decrease manufacturing costs.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A thin film transistor (TFT) comprising:
a gate formed on a substrate;
a gate insulation layer covering the gate and the substrate;
a channel layer formed on the gate insulation layer and corresponding to the gate;
a source coupled to the channel layer at a first side; and
a drain coupled to the channel layer at a second side opposite to the first side;
wherein the channel layer comprises a conductor layer and a semiconductor layer, the semiconductor layer is made of a semiconductive material, and the conductor layer is made of an electrically conductive material, the semiconductor layer comprises a first portion and a second portion; wherein the first portion and the second portion are each coupled to the conductor layer at opposite sides of the conductor layer, and the first portion and the second portion are separated from each other by a first distance; and wherein the electrically conductive material has a greater electron mobility than the semiconductive material; the first portion and the second portion of the semiconductor layer respectively cover a portion of the conductor layer, and the other portion of the conductor layer is not covered by the first portion and the second portion of the semiconductor layer.

2. The TFT according to claim 1, wherein the source and the drain are separated from each other by a second distance.

3. The TFT according to claim 2, wherein the first distance is less than or equal to the second distance.

4. The TFT according to claim 2, wherein the first distance is equal to the second distance.

5. A thin film transistor (TFT) comprising:
a gate formed on a substrate;
a gate insulation layer covering the gate and the substrate;
a channel layer formed on the gate insulation layer and corresponding to the gate;
a source coupled to the channel layer at a first side; and
a drain coupled to the channel layer at a second side opposite to the first side; wherein the channel layer comprises a conductor layer and a semiconductor layer, the semiconductor layer is made of a semiconductive material, and the conductor layer is made of an electrically conductive material, the semiconductor layer comprises a first portion and a second portion; wherein the first portion and the second portion are each coupled to the conductor layer at opposite sides of the conductor layer, and the first portion and the second portion are separated from each other by a first distance; wherein the semiconductor layer and the source and the drain are made in a same photo etching process.

6. A method for manufacturing a thin film transistor (TFT) comprising:
forming a gate on a substrate;
forming a gate insulation layer covering the gate and the insulation;
forming a conductor layer on the gate insulation layer to correspond to the gate, the conductor layer being made of an electrically conductive material;
forming a semiconductive pattern layer covering the conductor layer, the semiconductive pattern layer being made of a semiconductive material;
forming a source coupled to the channel layer at a first side and a drain coupled to channel layer at a second side opposite to the first side; and
removing a portion of the semiconductive pattern layer between the source and the drain to expose a portion of the conductor layer, thereby forming a semiconductor layer comprising a first portion and a second portion coupled to opposite sides of the conductor layer, wherein the first portion and the second portion are separated from each other by a first distance.

7. The method according to claim 6, wherein the electrically conductive material has a greater electron mobility than the semiconductive material.

8. The method according to claim 6, wherein the source and the drain are formed by:
coating a conductive material layer on the gate insulation layer and the semiconductive pattern layer;
forming a photoresist layer on the conductive material layer and patterning the photoresist layer to form a photoresist pattern having an opening using a photo etching process;
etching the conductive material layer to remove a portion of the conductive material layer exposed from the opening to form the source and the drain.

9. The method according to claim 7, wherein the electrically conductive material is a metal or a compound metal, and the semiconductive material is a metal oxide.

10. The method according to claim 8, wherein the semiconductor layer is formed by:
etching the semiconductive pattern layer to remove a portion of the semiconductive pattern layer between the source and the drain, thereby forming the semiconductor layer having the first portion and the second portion.

11. The method according to claim 10, wherein the first distance is created during etching of the semiconductive pattern layer, and a second distance between the source and the drain is created during etching of the conductive material layer; wherein the first distance is less than or equal to the second distance.

* * * * *